United States Patent
Abbott et al.

(10) Patent No.: US 8,247,312 B2
(45) Date of Patent: Aug. 21, 2012

(54) METHODS FOR PRINTING AN INK ON A TEXTURED WAFER SURFACE

(75) Inventors: Malcolm Abbott, Sunnyvale, CA (US); Maxim Kelman, Mountain View, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 816 days.

(21) Appl. No.: 12/108,888

(22) Filed: Apr. 24, 2008

(65) Prior Publication Data
US 2009/0325336 A1    Dec. 31, 2009

(51) Int. Cl.
H01L 21/36    (2006.01)

(52) U.S. Cl. ........ 438/478; 438/497; 438/498; 438/584; 257/E21.586

(58) Field of Classification Search ................... 438/497, 438/498, 478, 479, 584; 257/E21.586
See application file for complete search history.

(56) References Cited

U.S. PATENT DOCUMENTS

| | | | |
|---|---|---|---|
| 4,040,849 A | 8/1977 | Greskovich et al. | |
| 4,262,631 A | 4/1981 | Kubacki | |
| 4,330,358 A | 5/1982 | Grabmaier et al. | |
| 4,407,858 A | 10/1983 | Hanke et al. | |
| 4,876,218 A | 10/1989 | Pessa et al. | |
| 4,910,167 A | 3/1990 | Lee et al. | |
| 5,057,163 A | 10/1991 | Barnett et al. | |
| 5,141,893 A | 8/1992 | Ito et al. | |
| 5,262,357 A | 11/1993 | Alivisatos et al. | |
| 5,336,335 A | 8/1994 | Hall et al. | |
| 5,556,791 A | 9/1996 | Stevens et al. | |
| 5,576,248 A | 11/1996 | Goldstein | |
| RE36,156 E | 3/1999 | Hall et al. | |
| 6,080,606 A | 6/2000 | Gleskova et al. | |
| 6,084,175 A * | 7/2000 | Perry et al. | 136/256 |
| 6,111,191 A | 8/2000 | Hall et al. | |
| 6,559,479 B1 | 5/2003 | Lüdemann | |
| 6,791,117 B2 * | 9/2004 | Yoshitake et al. | 257/94 |
| 6,878,871 B2 | 4/2005 | Scher et al. | |
| 6,984,265 B1 | 1/2006 | Raguse et al. | |
| 7,579,205 B2 * | 8/2009 | Ikeda et al. | 438/46 |
| 2002/0192956 A1 | 12/2002 | Kizilyalli et al. | |
| 2003/0003300 A1 | 1/2003 | Korgel et al. | |
| 2003/0226498 A1 | 12/2003 | Alivisatos et al. | |
| 2005/0008880 A1 | 1/2005 | Kunze et al. | |

(Continued)

FOREIGN PATENT DOCUMENTS

DE    199 04 082    8/2000

(Continued)

OTHER PUBLICATIONS

Christiansen, T. et al., "Standard Operating Procedure: Spin-on-Glass Surface Level Characterization," Jun. 8, 2000, 7 pages.

(Continued)

*Primary Examiner* — Michael Trinh
(74) *Attorney, Agent, or Firm* — Foley & Lardner LLP (57) ABSTRACT

A method of printing an ink on a wafer surface configured with a set of non-rounded peaks and a set of non-rounded valleys is disclosed. The method includes exposing the wafer including at least some non-rounded peaks and at least some of the non-rounded valleys in a region to an etchant. The method further includes depositing the ink on the region, wherein a set of rounded peaks and a set of rounded valleys are formed.

12 Claims, 7 Drawing Sheets

U.S. PATENT DOCUMENTS

| | | | |
|---|---|---|---|
| 2005/0104125 A1 | 5/2005 | Sato et al. | |
| 2005/0126628 A1 | 6/2005 | Scher et al. | |
| 2006/0051505 A1 | 3/2006 | Kortshagen et al. | |
| 2006/0154036 A1* | 7/2006 | Kunze et al. | 428/210 |
| 2006/0237719 A1 | 10/2006 | Colfer et al. | |
| 2008/0160265 A1 | 7/2008 | Hieslmair et al. | |
| 2008/0160733 A1 | 7/2008 | Hieslmair et al. | |

FOREIGN PATENT DOCUMENTS

| | | |
|---|---|---|
| EP | 1551057 A | 7/2005 |
| GB | 1048564 A | 11/1966 |
| GB | 1077224 A | 7/1967 |
| JP | 2005/332913 A2 | 12/2005 |
| WO | WO 99/50890 | 10/1999 |
| WO | WO 2004/023527 | 3/2004 |
| WO | WO 2004/068536 A2 | 8/2004 |
| WO | WO 2006/096201 | 9/2006 |
| WO | WO 2008/039757 | 4/2008 |
| WO | WO 2008/073763 | 6/2008 |
| WO | WO 2008/076744 | 6/2008 |

OTHER PUBLICATIONS

Jang, W. I. et al., "Fabrication of MEMS Devices by Using Anhydrous HF Gas-phase Etching with Alcoholic Vapor" J. Micromech. Microeng., vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies," *IEEE Transactions on Components, Packaging, and Manufacturing Technology—Part A*, vol. 18, No. 3, Sep. 1995 pp. 471-477.

Lee, J. H. et al, "Gas-Phase Etching of Sacrificial Oxides Using Anhydrous HF and CH$_3$OH," 10$^{th}$ Annual Internat'l Workshop on MEMS, *IEEE*, Jan. 26-30, 1997, pp. 448-453.

Orfert, M. et al., "Plasma Enhanced Chemical Vapor Deposition of SiN-films for Passivation of Three-Dimensional Substrates" *Surface and Coatings Technology*, 116-119, 1999, pp. 622-628; published by Elsevier Science S.A.

Schmid, P. et al, "Plasma deposition of Si-N and Si-O passivation layers on three-dimensional sensor devices," *Surface and Coatings Technology*, 98, 1998, pp. 1510-1517; published by Elsevier Science S.A.

Ai et al., "Preparation and characterization of Si sheets by renewed SSP technique," *Journal of Crystal Growth*, vol. 270 (2004), pp. 446-454.

Q. Ban et al., "Substrate Materials for Poly-CSiTF Solar Cells: Optimization of Silicon Sheet from Powder", *Acta Metallurgica Sinica*, vol. 18, No. 3 (Jun. 2005), pp. 184-188.

Q. Ban et al., "Study on Preparation Technology of Polycrystalline Silicon Thin Film Solar Cells Based on SSP Substrate", *Acta Energiae Solaris Sinica*, vol. 25, No. 1 (Feb. 2004), pp. 95-98.

Bet et al., "Laser Forming of Silicon Films Using Nanoparticle Precursor," *Journal of Electronic Materials*, vol. 35, No. 5 (2006), pp. 993-1004.

Britton, D.T. and M. Härting, "Printed Nanoparticulate Composites for Silicon Thick Film Electronics," *Pure and Applied Chemistry*, vol. 78, No. 9 (2006), 1723-1739.

Ghosh et al., "Theory of the electrical and photovoltaic properties of polycrystalline silicon," *Journal of Applied Physics*, vol. 51, No. 1 (1980) pp. 446-454.

Grovenor, C. R. M., "Grain boundaries in semiconductors," *J. Phys. C: Solid State Phys.*, vol. 18 (1985), pp. 4079-4119.

Liang et al, "Characterisation of direct epitaxial silicon thin film solar cells on a low-cost substrate," *Solar Energy Materials & Solar Cells*, vol. 80 (2003), pp. 181-193.

Mataré, H..F., "Carrier transport at grain boundaries in semiconductors," *Journal of Applied Physics*, vol. 56, No. 10 (1984), pp. 2605-2631.

McCann et al, "A Review of Thin Film Crystalline Silicon for Solar Cell Applications. Part 1: Native Substrates," *Solar Energy Materials and Solar Cells*, vol. 68, No. 2 (May 2001), pp. 135-171.

Möller et al., "Sintering of Ultrafine Silicon Powder," *Journal of the American Ceramic Society*, vol. 68, No. 6 (1985), pp. 320-325.

Yang et al., "Effect of pressure on melting temperature of silicon," *Journal of Physics: Condensed Matter*, vol. 15 (2003), pp. 4961-4965.

"Crystalline Silicon Thin-Film Solar Cells," a Product Information Sheet published by Fraunhofer Institut Solare Energie Systeme, Oct. 2001, pp. 1-6.

D. V. Melnikov et al., "Quantum Confinement in Phosphorus-Doped Silicon Nanocrystals," *Physical Review Letters*, vol. 92 (2004), pp. 046802-1-046802-4.

Y. H. Tang et al., "Microstructure and Filed-Emission Characteristics of Boron-Doped SI Nanoparticle Chains," *Applied Physics Letters*, vol. 79 (2001), pp. 1673-1675.

T. Ifuku at al., "Fabrication of Nanocrystalline Silicon with Small Spread of Particle Size by Pulsed Gas Plasma," *Jpn. J. Appl. Phys.*, vol. 36, Part 1, No. 6B, (Jun. 1997), pp. 4031-4034.

A. N. Goldstein, "The Melting of Silicon Nanocrystals: Submicron Thin-film Structures Derived from Nanocrystal Precursors," *Applied Physics A*, vol. 62 (1996), pp. 33-37.

T. Shlga et al., "Photovoltaic performance and stability of CdTe/polymeric hybrid solar cells using a C60 buffer layer," *Solar Energy Materials and Solar Cells*, vol. 90, No. 12, (Jan. 2006), pp. 1849-1858; published by Elsevier Science Publishers, Amsterdam, NL.

J. R. Heath et al., "Nanocrystal Seeding: A low temperature route to polycrystalline Si films," *Applied Phys. Lett.* vol. 64, No. 26, Jun. 27, 1994, pp. 3569-3571.

G. Samdani et al., "Tiny Particles Aim for Big Markets," *Chemical Eng.*, Aug. 1994, pp. 35-39.

A. N. Goldstein et al., "Melting in Semiconductor Nanocrystals," *Science*, vol. 256, No. 5062, Jun. 5, 1992, pp. 1425-1427.

Ph. Buffat et al., "Side Effect on the Melting Temperature of Gold Particles," *Physical Review A*, vol. 13, No. 6, Jun. 1976.

F. Ercolessi et al., "Melting of Small Gold Particles: Mechanism and Size Effects," *Physical Review Letters*, vol. 66, No. 7, Feb. 18, 1991, pp. 911-914; published by The American Physical Society.

M. Wautelet, "Estimation of the variation of the melting temperature with the size of small particles, on the basis of a surface-phonon instability model,:" *J. Phys. D: Appl Phys*, vol. 24 (1991), pp. 343-346; published by IOP Publishing Ltd.

R. S. Berry et al., "Melting of Clusters and Melting," *Physical Review A*, vol. 30, No. 2, Aug. 1984: published by The American Physical Society.

International Search Report for PCT/US2007/087205, mailed May 28, 2008.

International Search Report for PCT/IB2004/000221 (WO 2004/068536 A2), mailed Aug. 30, 2004.

International Search Report for PCT/US2007/077765, mailed Feb. 1, 2008.

International Search Report for PCT/US2007/086376, mailed May 28, 2008.

International Search Report for PCT/US2007/086432, mailed May 28, 2008.

International Search Report for PCT/US2007/076549, mailed Jul. 25, 2008.

International Search Report for PCT/US2007/070134, mailed Aug. 11, 2008.

International Search Report for PCT/US2008/059038, mailed Jul. 18, 2008.

* cited by examiner

METHODS FOR PRINTING AN INK ON A TEXTURED WAFER SURFACE

FIELD OF DISCLOSURE

This disclosure relates in general to printing, and in particular printing an ink on a textured wafer surface.

BACKGROUND

Solar cells convert optical energy from sunlight into electricity. However, in order to be a viable energy source, the cost of the generated electricity must be competitive with alternative energy sources (e.g., coal, wind, nuclear, natural gas, etc.). One way of reducing net cost is to improve the efficiency of the solar cell. Efficiency is generally the percentage of sunlight (optical energy incident on the solar cell surface) that is converted into electrical energy.

There are various reasons why improving solar cell efficiency may be problematic. For example, because of the optical properties of materials used in the solar cell, such as silicon, a portion of the light incident on the solar cell surface may be reflected away and thus unavailable for the production of electricity. One method of reducing the amount of reflected light is the use of an anti-reflection coating (ARC). An ARC is a thin layer of a material (e.g. $SiO_2$, $TiO_2$ etc) that is grown on the surface of the solar cell (generally a silicon substrate or wafer). Optimizing the thickness and refractive index of the ARC reduces the amount of light reflected from the surface of the cell. Typically, an ARC coating is designed such that the reflection of light of a selected wavelength at normal incidence is reduced to zero. However, because incident light is comprised of various wavelengths of light, a substantial portion of incident light may still be reflected away.

An alternate technique involves texturing the surface of the wafer. Texturing generally involves etching the silicon wafer in a basic solution to form random upright peaks (e.g., pyramids, etc.) separated by valleys. Each peak generally includes an apex surface area and each valley includes a valley surface area. Consequently, larger peaks and/or deeper valleys have larger corresponding apex surface areas and valley surface areas.

Surface peaks and valleys tend to be very effective for trapping the light and minimizing front surface reflection. Typically, light that is reflected from an angled feature on a first pyramidal surface may be absorbed by second pyramidal surface, and thus used for the generation of electricity. In a typical solar cell a textured surface is combined with an AR coating to reduce the percentage of reflected light to around 1% for the wavelengths of interest.

Figure 1:
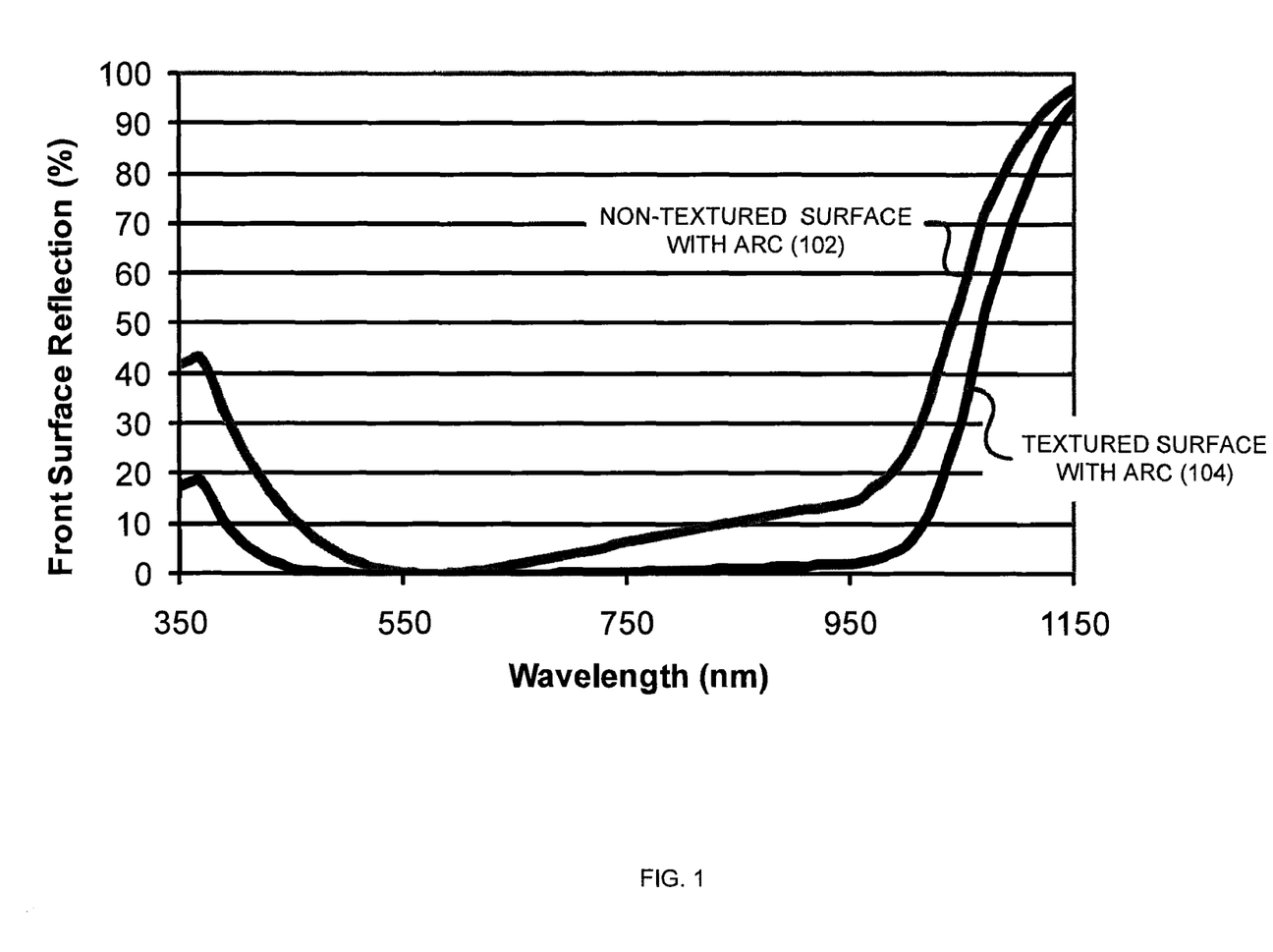
FIG. 1 shows a simplified diagram comparing reflectivity curves for both a textured solar cell wafer and a non-textured solar cell wafer.

Referring now to FIG. 1, a simplified diagram is shown comparing reflectivity values for a given wavelength of light incident on both a textured solar cell wafer and a non-textured solar cell with an ARC. Plot 102 shows the plot for the non-textured surface 102, while plot 102 shows a similar plot for a textured surface 104. In general, the ARC is a thin layer that uses destructive interference to reduce the reflection if incident light from the solar cell surface. Typically, an ARC layer thickness is chosen to be about one-quarter of a specific wavelength of light deep ($\lambda/4$). In this case, the ARC is optimized for 600 nm.

Consequently, if a first 600 nm beam is reflected off the top of the ARC, a second 600 nm beam will be reflected off the back of the ARC, traveling about half of its own wavelength (300 nm) further than the first beam. If the intensities of the two beams are exactly equal, then since they are exactly out of phase, they will destructively interfere and cancel each other. Consequently, there is no reflection from the surface, and all the energy of the beam must be in the transmitted into the solar cell. As can be seen, for a given wavelength of light where there is reflection, texturing substantially reduces the percentage of light reflected.

Unfortunately, the use of textured substrates presents significant challenges for the deposition of processing inks, such as for metallization and doping. That is, when a droplet of fluid is deposited on a surface, the drop is generally free to deform in shape and flow on the substrate surface. Its equilibrium shape is controlled not by the initial shape of the droplet, but by many additional factors such as the surface energy of the fluid, the contact angle the fluid makes with the substrate, gravity, the drying rate of the fluid and the morphology of the substrate surface. Comprehensive reviews of fluid interactions with surfaces can be found in R. Wenzel, *Resistance of solid surfaces to wetting by water*, Ind. Eng. Chem, 28(6), 988-994 (1936) and P. G. de Gennes, *Wetting: statics and dynamics*, Rev. Mod. Phys 57(3), 827-863 (1985).

When the surface is a textured surface, the fluid behaves differently than it would on a flat surface. Because of surface roughness, the contact angle of the fluid on the textured surface is generally lower, consequently increasing the radius of the droplet. In addition, the fluid is generally free to flow away from the peaks into the valleys of the surface. Thus, the flow of fluid on textured surfaces is generally problem for forming conformal coatings and for generating patterns of fluid on the substrate.

Consequently, it would be of advantage to selectively modify the surface texture of a solar cell in order to enable the conformal coating and pattern retention of fluids on textured surfaces.

SUMMARY

The invention relates, in one embodiment, to a method of printing an ink on a wafer surface configured with a set of non-rounded peaks and a set of non-rounded valleys. The method includes exposing the wafer including at least some non-rounded peaks and at least some of the non-rounded valleys in a region to an etchant, wherein a set of rounded peaks and a set of rounded valleys are formed. The method further includes depositing the ink on the region.

The invention relates, in another embodiment, to a method of printing an ink on a wafer surface configured with a set of non-rounded peaks and a set of non-rounded valleys. The method includes heating a region including at least some of the set of non-rounded peaks and the set of non-rounded valleys with a set of laser pulses from a laser apparatus, wherein each laser pulse of the set of laser pulses has a pulse duration, a fluence, and a wavelength, wherein a set of rounded peaks and a set of rounded valleys are formed. The method further includes depositing the ink on the region.

BRIEF DESCRIPTION OF THE DRAWINGS

The present invention is illustrated by way of example, and not by way of limitation, in the figures of the accompanying drawings and in which like reference numerals

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously stated, the use of textured substrates presents significant challenges for the deposition of liquids and pastes, such as for metallization and doping. In an advantageous manner, the inventors believe that modifying a portion of the textured surface, by localized chemical rounding or re-crystallization, a relatively flatter surface may be created such that a liquid (e.g., nanoparticle ink, etc.) and/or paste may be successfully deposited. For example the wafer may be exposed to an etchant, such as in an etchant dip, an inkjet printer, or a screen printer with an etchant. Likewise, the wafer may be etched or flattened with a laser.

Nanoparticle inks, in particular, may be used to replace some of the processing steps required to fabricate efficient solar cell structures. See U.S. Patent App. No. 60/969,887, entitled "Methods And Apparatus For Creating Junctions On A Substrate," filed Sep. 4, 2007, which is incorporated by reference. Generally, such inks allow the selective deposition of doped regions on solar cell wafer substrates without requiring additional masking steps (e.g. with an inkjet printer). Consequently, the design of such solar cells may require good spatial control of the ink deposition and a uniform coating, which may be problematic.

Characteristics of Group IV Nanoparticles

In general, a nanoparticle is a microscopic particle with at least one dimension less than 100 nm. The term "Group IV nanoparticle" generally refers to hydrogen terminated Group IV nanoparticles having an average diameter between about 1 nm to 100 nm, and composed of silicon, germanium, carbon, or combinations thereof. The term "Group IV nanoparticle" also includes Group IV nanoparticles that are doped.

In comparison to a bulk material (>100 nm) which tends to have constant physical properties regardless of its size (e.g., melting temperature, boiling temperature, density, conductivity, etc.), nanoparticles may have physical properties that are size dependent, and hence useful for applications such as junctions. For example, semiconductor nanoparticles may be more easily and cheaply patterned into forming p-n junctions when compared to alternate methods, such as silk-screening or deposition.

In an advantageous manner, the Group IV nanoparticles may be formed into a substantially spherical shape in order to minimize contamination. In general, of all the solids having a given volume, a sphere is the one with the smallest surface area. Likewise, of all solids having a given surface area, the sphere is the one having the greatest volume. Consequently, a spherical nanoparticle will tend to shield the greatest number of Group IV atoms from contamination, and hence is beneficial to junction creation.

In general, semiconductor nanoparticles typically must be formed into dense connected regions in order to create a junction, and thus enable the solar cell to generate electricity. One such method is sintering. Generally a method for making particles adhere to each other, interacting nanocrystals sinter before size-dependent melting occurs. A. N. Goldstein, *The melting of silicon nanocrystals: Submicron thin-film structures derived from nanocrystal precursors*, APPLIED PHYSICS A., 1996. Consequently, Group IV nanoparticles that are substantially spherical and preferably between about 4 nm and about 100 nm in diameter tend to sinter at lower temperatures, and hence are beneficial to create junctions. In yet another configuration, the Group IV nanoparticles are substantially spherical and more preferably between about 4.0 nm and about 20.0 nm in diameter. In yet another configuration, the Group IV nanoparticles are substantially spherical and most preferably 7.0 nm.

Characteristics of Group IV Nanoparticle Colloidal Dispersions (Inks)

Because of their small size, nanoparticles tend to be difficult to manipulate. Consequently, in an advantageous manner, assembled nanoparticles may be suspended in a colloidal dispersion or colloid, such as an ink, in order to transport and store the nanoparticles.

Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles.

In general, the Group IV nanoparticles are transferred into the colloidal dispersion under a vacuum, or else an inert substantially oxygen-free environment. In addition, the use of particle dispersal methods and equipment such as sonication, high shear mixers, and high pressure/high shear homogenizers may be used to facilitate dispersion of the nanoparticles in a selected solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor nanoparticles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl)silane)(MTTMSS), tris(trimethylsilyl)silane (TTMSS), decamethyltetrasiloxane (DMTS), and trimethylmethoxysilane (TMOS).

Once formulated, the colloidal dispersion may be applied to a substrate and subjected to a heat treatment in order to sinter the Group IV nanoparticles into a densified conductive film. Examples of application methods include, but are not limited to, roll coating, slot die coating, gravure printing, flexographic drum printing, and ink jet printing methods, etc.

In one particular configuration, in an advantageous manner, the colloidal dispersion may be applied in patterned regions by an inkjet printer. In general, inkjet printers operate by propelling various size (mostly tiny) droplets of liquid or molten material (ink) onto a substrate. Two types of ink jet printers are commonly used for the deposition of colloidal dispersion: thermal inkjets and piezoelectric inkjets.

Thermal inkjets use print cartridges with a series of tiny electrically heated chambers constructed by photolithography. To produce a pattern, the printer runs a pulse of current through the heating elements causing a steam explosion in the chamber to form a bubble, which propels a droplet of ink onto the substrate. The ink's surface tension as well as the condensation and thus contraction of a vapor bubble, pulls a further charge of ink into the chamber through a narrow channel attached to an ink reservoir.

In contrast, piezoelectric inkjets use a piezoelectric material in an ink-filled chamber behind each nozzle instead of a heating element. When a voltage is applied, the piezoelectric material changes shape or size, which generates a pressure pulse in the ink forcing a droplet of ink from the nozzle. This is essentially the same mechanism as the thermal inkjet but generates the pressure pulse using a different physical principle.

In the case of Group IV nanoparticles, the colloidal dispersions should disperse well in the selected solvents and should easily filter though a 0.5 μm filter (more preferably through a 0.3 μm filter), in order to optimize printability.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific (densified nanoparticle thin film) layer for a junction is formulated by blending doped and undoped Group IV nanoparticles to achieve the requirements for that layer. More details are disclosed in U.S. patent application Ser. No. 11/950,024, filed on Dec. 4, 2007, and entitled Methods For Creating Densified Group IV Seminconductor, which is incorporated by reference.

For example, the densified nanoparticle thin film layer may be made by first depositing a nanoparticle ink, including a set of Group IV semiconductor particles and a solvent, as previously described. The deposited nanoparticle ink may then be heated between about 30° C. and about 300° C., and for a time period of between about 1 minute and about 60 minutes, in order to substantially remove the solvent and form a non-densified nanoparticle thin film layer. The non-densified nanoparticle thin film layer is then heated between about 100° C. and about 1000° C., and for time period of between about 5 seconds and about 10 hours, in order to form a densified nanoparticle thin film layer.

Alternatively, the blended Group IV nanoparticle colloidal dispersions may be used to compensate for substrate defects, such as the passivation of oxygen atoms in order to reduce undesirable energy states.

Furthermore, in an advantageous manner, doped nanoparticles may themselves be used as a carrier to diffuse dopants into the wafer. A colloidal dispersion of doped nanoparticles (n-type or p-type respectively) may be deposited on the wafer with an appropriate deposition technique such as ink jet printing, and then heated in order to diffuse the dopant into the wafer. Since the nanoparticle derived layer is itself conductive it does not need to be removed to produce working solar cells. Thus, a liquid batch process step may be eliminated improving production yield.

Printing Nanoparticle Ink on Textured Surfaces

As previously stated, solar cells often incorporate a random upright pyramid texture on a front surface to reduce reflection and to increase efficiency. However, such a textured surface typically contains geometric features onto which it can be difficult to uniformly deposit a fluid, such as a nanoparticle ink. That is, the fluid tends to slump away from the peaks and build up in the valleys between peaks, thus resulting in non-uniform surface coverage. When a subsequent layer, such as a metal electrode, is deposited on this non-uniform surface, the exposed pyramid peaks can form leakage paths that can greatly decrease solar cell performance.

Figure 2A:
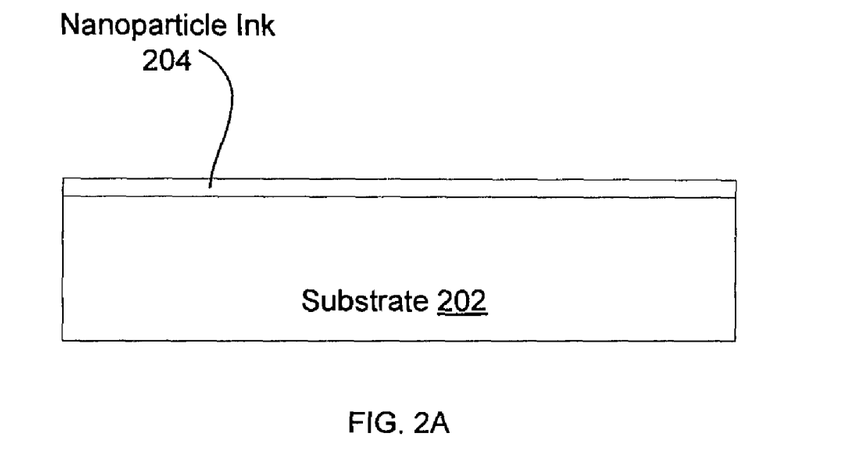
FIGS. 2A-B show nanoparticle ink application on various surfaces.
Figure 2B:
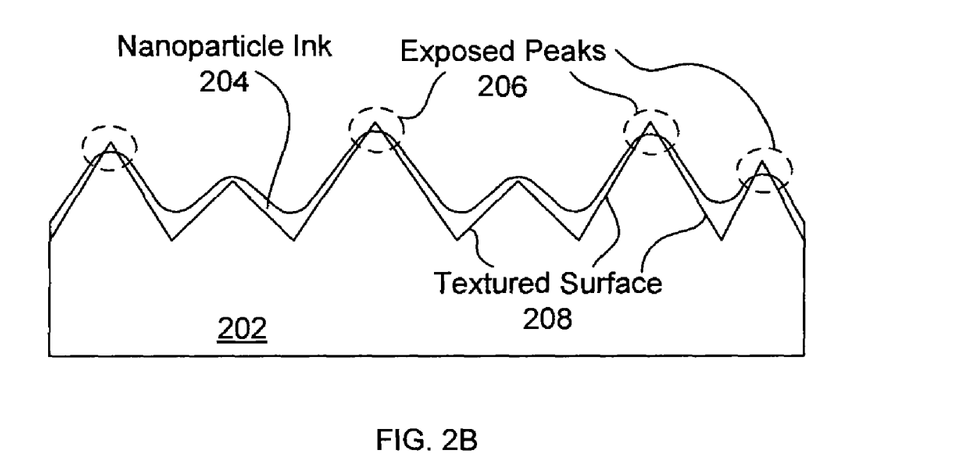

Referring now to FIGS. 2A-B, a set of simplified drawings of nanoparticle ink application on various surfaces is shown, in accordance with the invention. FIG. 2A shows a nanoparticle ink 204 that is printed or otherwise applied to a substantially level or non-textured surface of wafer substrate 202. Because the surface is not textured, nanoparticle ink 204 may be substantially uniform across the wafer surface.

In contract, FIG. 2B shows a textured surface 208 (e.g., with pyramid structures) is shown on wafer 202. For example, such peaks are from about 0.5 μm to about 10 μm tall. Here, application of nanoparticle ink 204 can result in substantial non-uniformity because the nanoparticle ink is a liquid that pools in low areas. As a result, exposed peaks 206, as well as thinning near other pyramid peaks can occur.

Figure 3A:
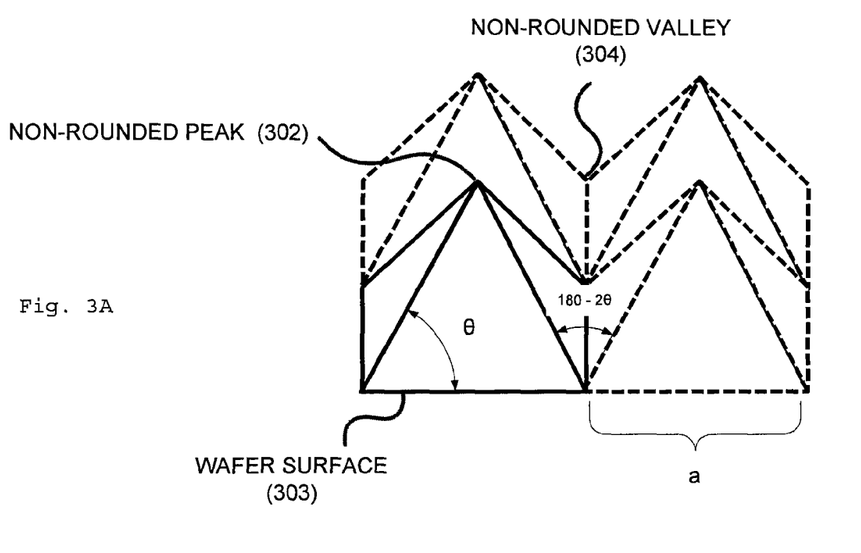
FIGS. 3A-B show a set of simplified diagrams comparing a set of textured solar cell surfaces, in accordance with the invention.
Figure 3B:
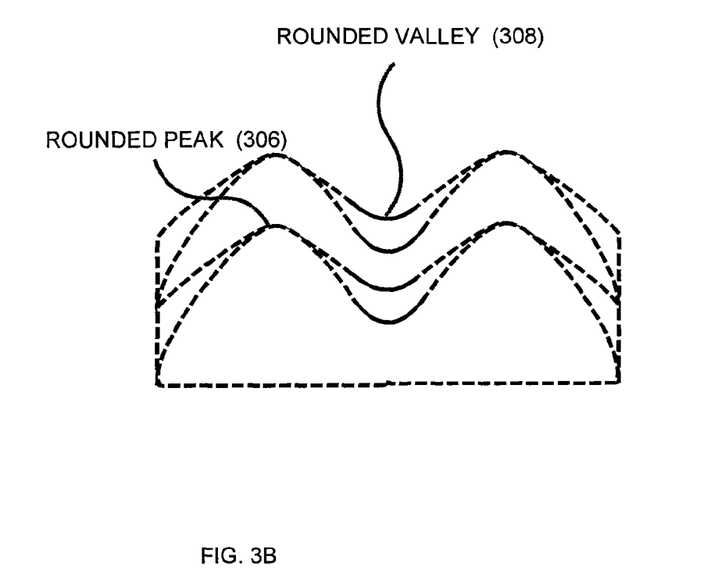

Referring now to FIGS. 3A-B, a set of simplified diagrams is shown comparing a set of textured solar cell surfaces, in accordance with the invention. FIG. 3A illustrates solar cell surface roughness, in accordance with the invention. FIG. 3A shows a textured solar cell surface prior to rounding, whereas FIG. 3B shows a textured surface after rounding.

In general, silicon wafers used for solar cells are crystalline in nature. Based on the intercepts of a plane with the three crystal axes, Miller indices are commonly used to specify lattice orientation. A pyramidal texturing etch is generally designed to preferentially remove silicon from the wafer surface to expose the (111) [Miller index] crystalline planes. For a (001) oriented Si wafer, exposure to a pyramidal etch will result in the appearance of peaks where each surface is a (111) plane.

Referring to FIG. 3A, a solar cell with a typical pyramidal texturing etch is shown with non-rounded apexes 302 and non-rounded valleys 304. Typically, the pyramid angle θ between the pyramidal edges and the wafer surface 303 is approximately 54.7°, whereas the valley angle 180−2θ of the valley between next to proximate pyramidal edges is about 180°−(2×54.7°) or 70°.

In contrast, referring now to FIG. 3B, a textured surface is shown after rounding. Rounding refers to the reduction of the sharpness of all edges of the surface. As the edges of the peaks get smoother, the total exposed surface area of the substrate is reduced, approaching the minimum possible surface area which would exist for a fully planar substrate. That is, the apex surface area and/or the valley surface area are reduced.

For example, if the base of a pyramid is a defined as a square of sides a (i.e., $a^2$), and the surface area of the pyramid is defined as $2a^2 \tan \theta$, then the ratio of surface area of the pyramid to base area is $[(2a^2 \tan \theta)/a^2]$ or just $2 \tan \theta$. Consequently, the ratio of a rounded apex 306 or a rounded valley 308 ($\text{ratio}_{rounded}$) would be less than the corresponding ration of non-rounded apex 302 or non-rounded valley 304. That is, $\text{ratio}_{rounded} < \text{ratio}_{non-rounded}$.

Figure 4A:
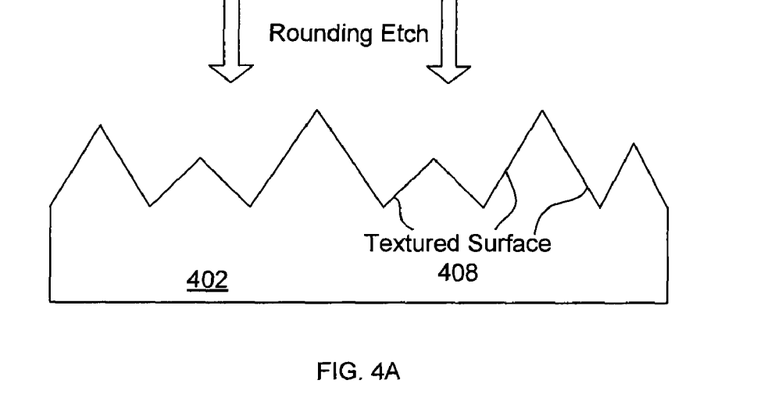
FIGS. 4A-C show cross-section diagrams of an example processing flow for creating texturing shapes more favorable to uniform nanoparticle ink application in accordance with embodiments of the present invention.
Figure 4B:
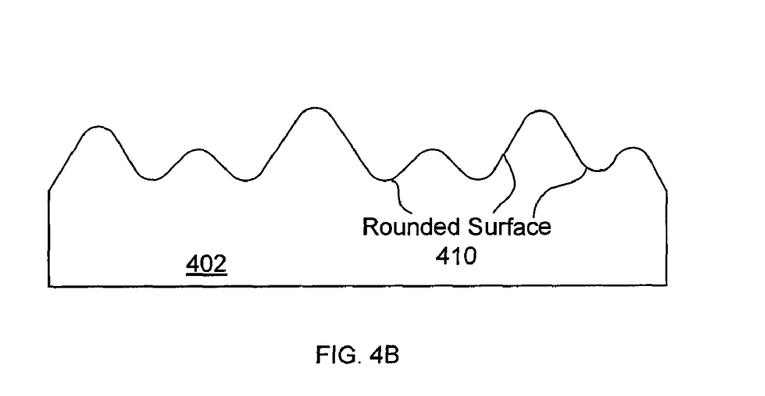
Figure 4C:
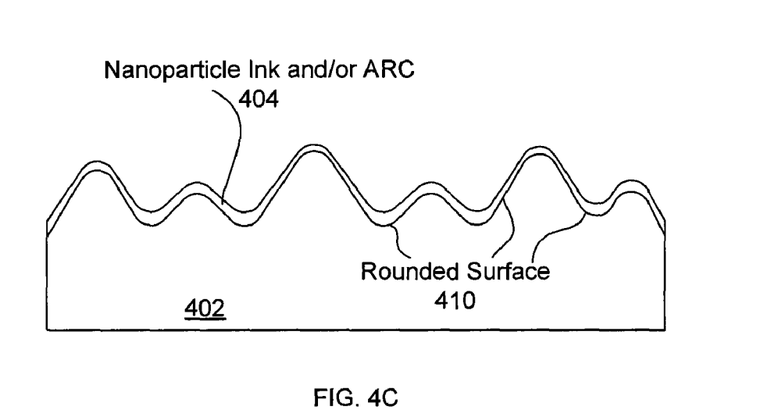

Referring now to FIGS. 4A-C, shown are cross-section diagrams of an example processing flow for creating texturing shapes more favorable to uniform nanoparticle ink application in accordance with embodiments of the present invention.

FIG. 4A shows textured surface 408 with pyramidal structures on wafer 402, prior to the addition of a chemical rounding etch. As previously described, such pyramidal structures are typically from about 0.5 μm to about 10 μm tall.

FIG. 4B shows a chemical rounding etch can be utilized to slightly flatten wafer surface texturing, resulting in, e.g., rounded surface 410 on wafer 402. One example of a chemical solution which can be used for such rounding is $HNO_3$:HF (e.g., about 1:19 for about 2 minutes). Acetic acid can also be added to this solution to improve its performance. The surface texture can also be decreased by using a liquid-free approach, such as plasma etching in a fluorine containing plasma, such as $SF_6$, $CF_4$, $NF_3$, $SF_6$ etc. As shown in FIG. 4C (400 C), nanoparticle ink 404 is printed on rounded surface 410. Accordingly, because this wafer surface is not pyramidal, but rather slightly rounded, a substantially uniform application of nanoparticle ink 404 can be achieved. Alternatively, the peaks and valleys may be substantially removed, creating a substantially non-textured surface.

Figure 5:
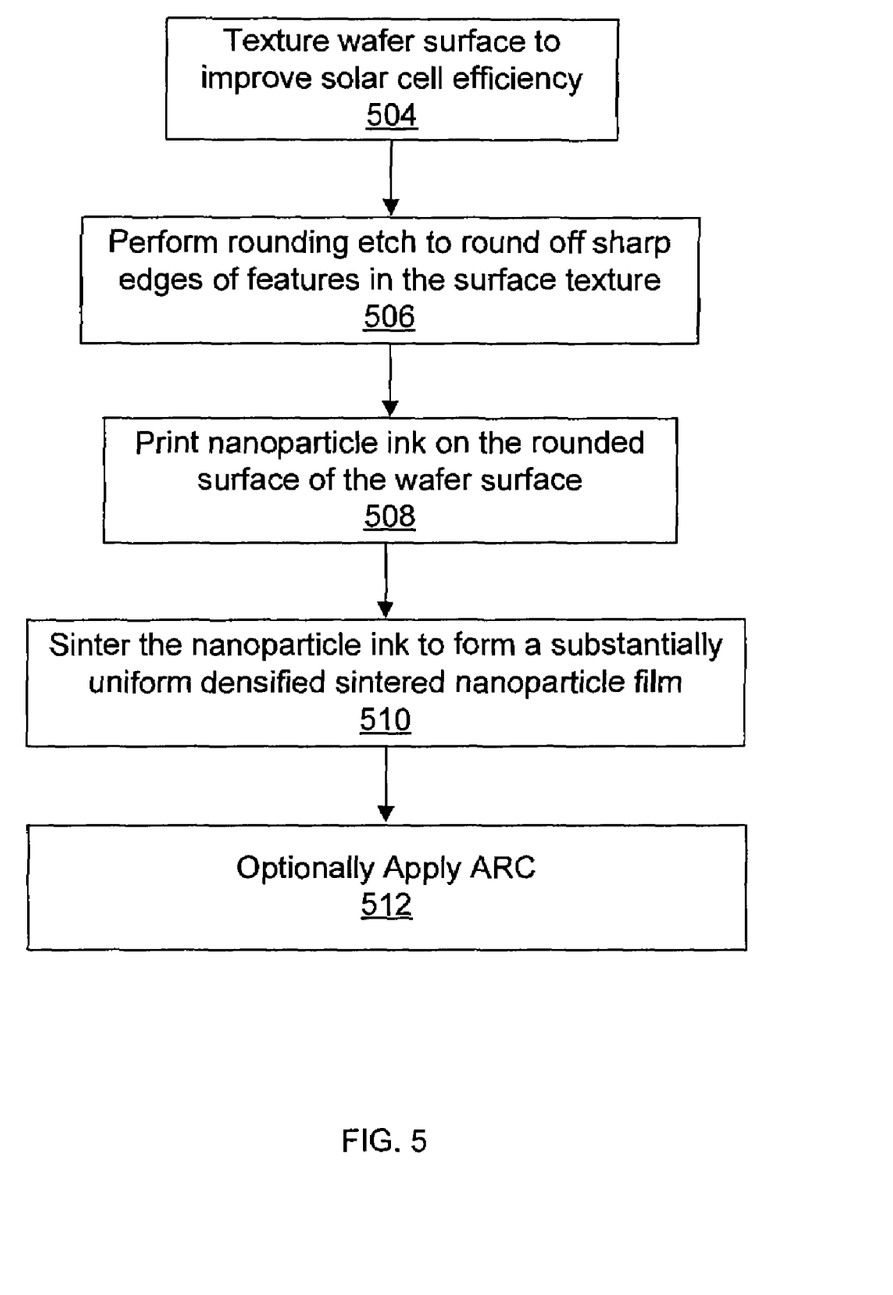
FIG. 5 shows a simplified method of texturing a wafer surface with a set of etchants in order to improve light trapping, in accordance with the present invention.

Referring now to FIG. 5, a simplified method is shown of texturing a wafer surface with a set of etchants in order to improve light trapping, in accordance with the present invention. Initially, a rounding etch (e.g., including $HNO_3$:HF) is performed to round off relatively sharp edges of peaks in the surface texture 506. Nanoparticle ink can then be printed on the rounded wafer surface 508. The printed nanoparticle ink can then be sintered to form a substantially uniform and densified sintered nanoparticle film 510. Finally, an ARC may be applied in order to reduce the reflection if incident light from the solar cell surface 512.

In this fashion, a chemical etch can be applied to an entire wafer to round the relatively sharp pyramid features. However, this approach can involve a trade-off with solar cell reflection characteristics that are improved by the sharp pyramidal shapes. Alternatively, particular areas of the wafer surface may be targeting for such pyramid smoothing. For example, such targeted areas can include those to be covered by a metal (e.g., to form an electrode) in subsequent steps. Because metal electrodes introduce shading into a solar cell in those areas anyway, smoothing of a textured surface beneath those electrodes has no substantial affect on surface reflection characteristics. Further, any area or localized region where nanoparticle ink is to be placed (e.g., for a contact, an electrode, etc.) can undergo such localized processing for smoothing a textured surface.

Another solution in particular embodiments is to employ localized heat from a laser in order to melt and re-crystallize a targeted surface region. During this process, the silicon surface region can become liquid, and may flow in such a way so as to substantially flatten that portion of the surface. After re-crystallizing the surface, the textured surface may not contain overly sharp pyramid features prone to cause difficulty in the application of nanoparticle ink.

Figure 6A:
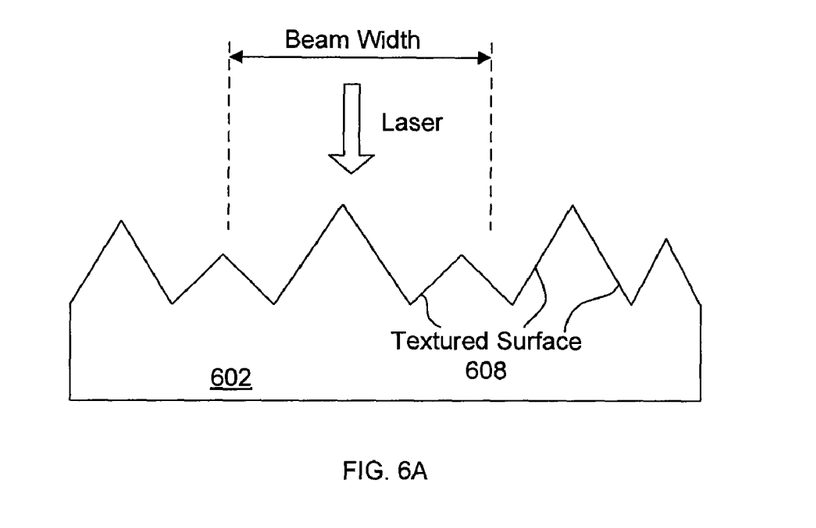
FIGS. 6A-C show cross-section diagrams of an example processing flow for targeted smoothing of textured shapes in accordance with embodiments of the present invention; and, FIG. 7 shows a simplified method for texturing a wafer surface with a laser to improve light trapping, in accordance with the invention.
Figure 6B:
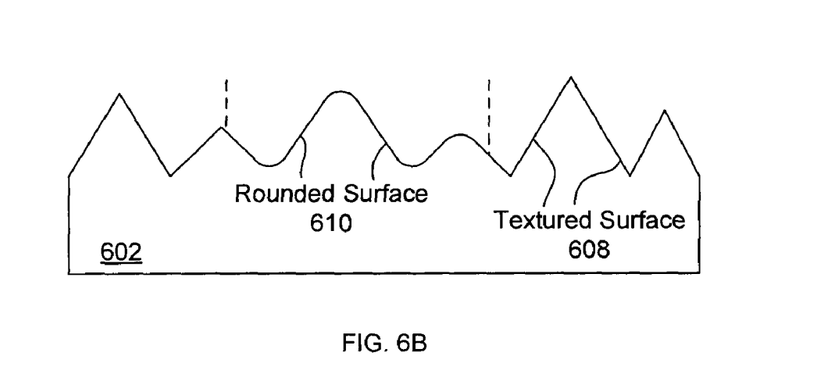
Figure 6C:
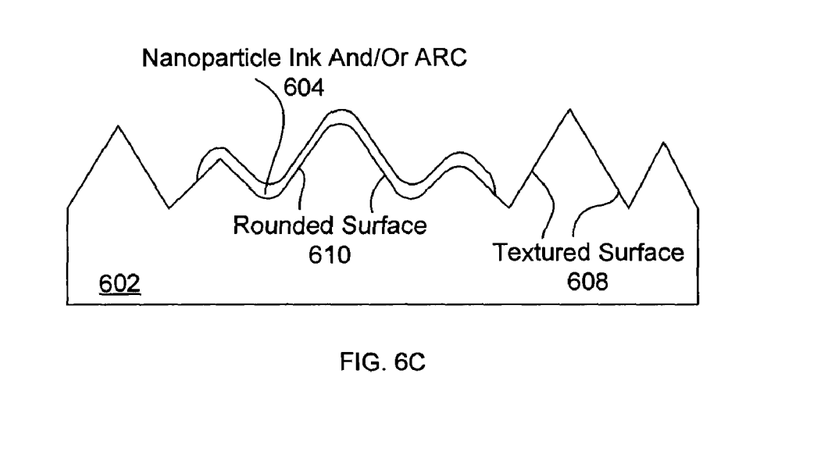

Referring now to FIGS. 6A-C, simplified cross-sectional diagrams are shown of a textured wafer, in accordance with the invention. FIG. 6A shows a simplified diagram of a textured wafer, prior to the application of a texture smoothing laser. FIG. 6B shows the wafer of FIG. 6A, after the application of a laser beam. FIG. 6C, shows the wafer of FIG. 6B, after the application of a nanoparticle ink.

In FIG. 6A, a simplified diagram is shown of wafer 602 with textured surface 608, prior to the application of a texture smoothing laser. One example of a laser which can be used is a Q-switched Nd:YAG laser with a pulse width between about 1 ns and about 300 ns, and operating at either about 532 nm or about 1064 nm wavelengths. Using appropriate optics the area of laser irradiation may be adjusted to features with dimensions between 10 um-100 um. The laser pulse fluence may be strong enough to melt the surface region, but not so strong so as to cause ablation. For the example laser described above, an appropriate fluence at a wavelength of 532 nm can be in a range of from about 0.5 $J/cm^2$ to about 1.5 $J/cm^2$. In addition the laser may be used to ablate the textured surface. Ablation is generally the removal of material from the surface of an object, there the textured wafer surface, by vaporization. In general, once a portion of the wafer surface is ablated, it becomes substantially is smooth (i.e., untextured).

In FIG. 6B, a simplified diagram is shown of the wafer of FIG. 6A, in which a rounded surface 610 has been formed by a laser in a region corresponding to a width of the laser beam.

In FIG. 6C, a simplified diagram showing the wafer of FIG. 6B, after the deposition of nanoparticle ink 604 on rounded surface area 610 (or on a substantially flattened surface) corresponding to the laser beam width.

Figure 7:
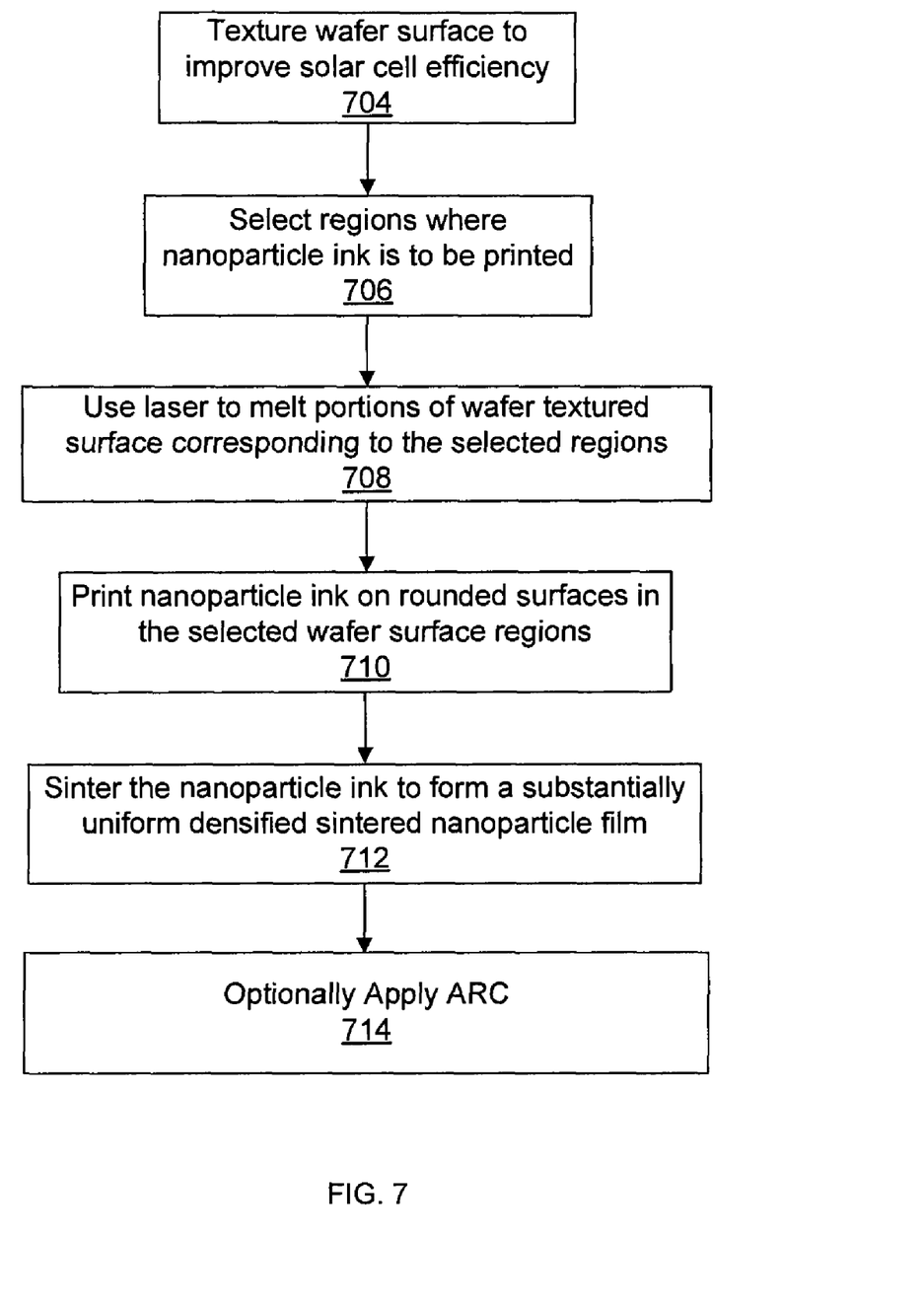

Referring now to FIG. 7, a simplified method is shown for modifying a wafer surface with a laser in accordance with the invention. Initially, regions where nanoparticle ink is to be printed are selected 706. Next, a laser is used to melt portions of the textured surfaces on the wafer corresponding to the selected regions 708. A nanoparticle ink may be printed on rounded or flattened surfaces in the selected wafer surface regions 710. The printed nanoparticle ink can then be printed to form a substantially uniform sintered and densified nanoparticle film 712. Finally, an ARC may be applied in order to reduce the reflection if incident light from the solar cell surface 714.

In general, texturing provides reduced front surface reflection, which increases solar cell efficiency. Further, laser surface flattening can be targeted such that substantially only a surface area under a printed ink layer may be affected, thus allowing remaining surfaces to retain high-quality anti-reflection properties. Additionally, application of such a laser in particular embodiments can also be used to simultaneously define a mask in a surface dielectric.

Also in certain configurations, masking, as an alternative to a laser, can be used to smooth or flatten targeted textured surface areas. One particular example of this approach is to inkjet print a polymer such as a hot melt wax or a UV curable polymer to form an etch mask. Deposition of such inks with state of the art inkjet printing can produce printed features in the 50-500 um range. These etch masks are designed to be resistant to common etchants such as HF solutions. An HF solution can thus be employed to locally remove the SiN coating in the areas that are exposed by the etch mask. Subsequent etching with an isotropic Si etch can then be performed to locally planarize the Si contact areas in these exposed areas. The latter etchants are also suitable to remove the polymer etch mask but they will not etch the SiN coating.

In yet other configurations, both a SiN etchant (HF solution) and/or an isotropic Si etchants can be inkjet printed to etch a desired contact pattern on a textured Si surface. This approach will yield the same effect to smooth or flatten targeted local contact areas without the need of a separate masking step or laser processing.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of coating a silicon wafer with an ink, the silicon wafer including a surface with a set of non-rounded peaks and a set of non-rounded valleys, wherein each non-rounded peak of the set of non-rounded peaks includes a first apex surface area, wherein each non-rounded valley of the set of non-rounded valleys is defined between two proximally located non-rounded peaks, and wherein each non-rounded valley further includes a first valley surface area, comprising,
    adding an etch mask to the surface of the silicon wafer with the set of non-rounded peaks and the set of non-rounded valleys,
    exposing the silicon wafer including at least some of the non-rounded peaks and at least some of the non-rounded valleys in a region to an etchant while the non-rounded peaks and the non-rounded valleys outside the region is not exposed to the etchant, wherein a set of rounded peaks and a set of rounded valleys are formed in the region, each rounded peak of the set of rounded peaks having a second apex surface area smaller than the first apex surface area, each rounded valley of the set of the rounded valleys having a second valley surface area smaller than the first valley surface area, thereby obtaining the silicon wafer including the rounded peaks and the rounded valleys in the region and the non-rounded peaks and the non-rounded valleys outside the region; and,
    depositing the ink on the region.

2. The method of claim 1, wherein the non-rounded peaks have a pyramid shape.

3. The method of claim 1, wherein the etch mask is one of a hot melt wax or a UV curable polymer.

4. The method of claim 1, where the ink is a nanoparticle ink, the nanoparticle ink including a set of Group IV semiconductor particles and a solvent.

5. The method of claim 4, wherein after the step of depositing the ink on the region, further including the steps of:
    heating the nanoparticle ink to a first temperature and for a first time period to form a non-densified thin film;
    heating the non-densified thin film to a second temperature and for a second time period to form a densified thin film.

6. The method of claim 5, wherein the first temperature is from about 30° C. to about 300° C., and the first time period is from about 1 minute to about 60 minutes.

7. The method of claim 6, wherein the second temperature is from about 100° C. to about 1000° C., and the second time period is from about 5 seconds to about 10 hours.

8. The method of claim 1, wherein the etchant includes an $HNO_3$ etchant and a HF etchant.

9. The method of claim 8, wherein a ratio of the $HNO_3$ etchant to the HF etchant is about 1 to about 19.

10. The method of claim 9, wherein the etchant is applied for about 2 minutes.

11. The method of claim 1, wherein the silicon wafer is a crystalline silicon wafer for a solar cell.

12. The method of claim 1, wherein said depositing deposits the ink on the region uniformly.

* * * * *